United States Patent [19]

Angelopoulos et al.

[11] Patent Number: 5,310,625

[45] Date of Patent: May 10, 1994

[54] PROCESS FOR FORMING NEGATIVE TONE IMAGES OF POLYIMIDES USING BASE TREATMENT OF CROSSLINKED POLYAMIC ESTER

[75] Inventors: Marie Angelopoulos, Briarcliff Manor; Daniel G. Berger, Wappingers Falls, both of N.Y.; Jeffrey W. Labadie, Sunnyvale, Calif.; Eric D. Perfecto, Wappingers Falls, N.Y.; Martha I. Sanchez, Palo Alto, Calif.; Sally A. Swanson; Willi Volksen, both of San Jose, Calif.

[73] Assignee: International Business Machines Corporation, Armonk, N.Y.

[21] Appl. No.: 101,261

[22] Filed: Aug. 3, 1993

Related U.S. Application Data

[63] Continuation of Ser. No. 850,636, Mar. 13, 1992, abandoned.

[51] Int. Cl.$^5$ .............................................. G03C 5/56
[52] U.S. Cl. .................................... 430/325; 430/311; 430/330; 430/283
[58] Field of Search ................. 430/325, 330, 283, 311

[56] References Cited

U.S. PATENT DOCUMENTS

| | | | |
|---|---|---|---|
| 2,880,230 | 3/1959 | Edwards et al. | 260/475 |
| 3,179,630 | 4/1965 | Endrey et al. | 260/78 |
| 3,179,631 | 4/1965 | Endrey et al. | 260/78 |
| 3,179,632 | 4/1965 | Hendrix et al. | 260/78 |
| 3,179,633 | 4/1965 | Endrey et al. | 260/78 |
| 3,261,811 | 7/1966 | Tatum | 260/47 |
| 3,282,898 | 11/1966 | Angelo et al. | 260/47 |
| 3,316,212 | 4/1967 | Angelo et al. | 260/47 |
| 3,376,260 | 4/1968 | Fritz et al. | |
| 3,423,366 | 1/1969 | De Brunner et al. | 260/65 |
| 3,518,219 | 6/1970 | Lavin et al. | 260/33.4 |
| 4,218,555 | 8/1980 | Antonoplos et al. | 528/126 |
| 4,242,437 | 12/1980 | Rohloff | 430/270 |
| 4,252,707 | 2/1981 | Ruid | 260/30.2 |
| 4,451,551 | 5/1984 | Kataoka et al. | 430/270 |
| 4,849,501 | 7/1989 | Diller et al. | 528/353 |
| 4,898,806 | 2/1990 | Pfeifer | 430/325 |
| 4,942,108 | 7/1990 | Moreau et al. | 430/325 |
| 5,122,440 | 6/1992 | Chien | 430/325 |

FOREIGN PATENT DOCUMENTS

| | | | |
|---|---|---|---|
| 0020773 | 9/1979 | European Pat. Off. | C08G 73/10 |
| 131882A1 | 6/1984 | European Pat. Off. | G03F 7/10 |
| 224680A2 | 10/1986 | European Pat. Off. | G03F 7/08 |
| 355927 | 8/1989 | European Pat. Off. | G08G 73/10 |
| 425142A2 | 10/1990 | European Pat. Off. | G03F 7/004 |
| 436457A2 | 11/1990 | European Pat. Off. | G03F 7/039 |
| 502400A1 | 2/1992 | European Pat. Off. | G03F 7/038 |

OTHER PUBLICATIONS

Lavrov et al., "Kinetics and Mechanism of the Cyclization of Polyamido Esters to Polyimides", A. N. Vysokomol. Soedin., Ser. B 1978, 20(10), 786–8.

Mikitaev et al., "Imiting Steps in the Solid-Phase Cyclization of Polyaminoacids", Doklady Akademii Nauk SSSR, vol. 283, No. 1, pp. 133–135, 1985.

Nobuyuki et al., "Preparation of Aromatic Polyimides Containing Polyamic Acid Structure", (Mitsui Toatsu Chemicals, Inc.), Chemical Abstracts, vol. 114, 43797e.

Koton et al., "Investigation of the Kinetics of Chemical Imidization", Polymer Science U.S.S.R., vol. 24, No. 4, p. 800, 1982.

Rubner et al., "A Photopolymer—The Direct Way to Polyimide Patterns", Photographic Science and Engineering, vol. 23, No. 5, Sep./Oct. 1979, pp. 303–309.

Pottiger, "Second Generation Photosensitive Polyimide Systems", Solid State Technology/Dec. 1989, pp. S1–S4.

Moore et al., "An Intrinsically Photosensitive Polyimide", Chemistry of Materials, 1 163 (1988).

(List continued on next page.)

Primary Examiner—Christopher Rodee
Attorney, Agent, or Firm—Robert B. Martin

[57] ABSTRACT

The present invention relates to an improved process for forming negative tone images of photosensitive polyimides on a substrate having improved wall angles.

4 Claims, No Drawings

OTHER PUBLICATIONS

Omote et al., "Fluorine-Containing Photoreactive Polyimide: 4. The Dependence of the Content of Pendant O-Naphthoquinonediazide on the Mechanism of Photochemical Reaction in a Novel Photoreactive Polyimide", Polymer Communications, 1990, vol. 31, April, pp. 134–136.

Omote et al., "Fluorine-Containing Photoreactive Polyimide 5: A Novel Positive-Type Polyimide Based on Photoinducted Acidolysis", Journal of Polymer Science: Part C: Polymer Letter, vol. 28, pp. 59–64 (1990).

"Photosensitive Polyimides", Ube INdustries, Ltd., Jpn. Kokai Tokkyo Koho JP 59,108,031 [84,108,031[, Jun. 22, 1984, abstract.

"Photosensitive Polyimides Soluble in Organic Solvents", Ube Industries Ltd., Jpn. Kokai Tokkyo Koho JP 60 06,729 [85 06,729], Jan. 14, 1985, abstract.

"Organic-Solvent-Soluble Photosensitive Poly Amide-Imides", Ube Industries, Ltd. Jpn. Kokai Tokkyo Koho JP 60 06,728 [85 06,728], Jan. 14, 1985, abstract.

Vinogradova et al., "Chemical Cyclization of Poly (Amido-Acids) in Solution" Vysokomol. Soyed A16 No. 3, 506, 1974.

Bessonov et al., "Polyimides Thermally Stable Polymers", Consultants Bureau Publishers, 1987.

Craig, "Polyimide Coatings", E. I. DuPont de Nemours & Company Inc., Electronic Materials Handbook, vol. 1: Packaging, ASM International, 1989.

Yoda et al., "New Photosensitive High Temperature Polymers for Electronic Applications", J. Macromol. Sci.-Chem., A21(13&14), pp. 1641–1663 (1984).

Pfeifer et al., "Direct Photoimaging of Fully Imidized Solvent-Soluble Polyimides", Central Research Laboratories and Plastics and Additives Division, Product Development, Ciba-Geigy Ltd., CH-4002 Basle/Switzerland.

PROCESS FOR FORMING NEGATIVE TONE IMAGES OF POLYIMIDES USING BASE TREATMENT OF CROSSLINKED POLYAMIC ESTER

This is a continuation of copending application Ser. No. 07/850,636 filed on Mar. 13, 1992 now abandoned.

FIELD OF THE INVENTION

The present invention relates to an improved process for forming negative tone images of photosensitive polyimides on a substrate. The imaged polyimides ar useful as dielectric pattern for forming integrated circuits.

BACKGROUND OF THE INVENTION

Polyimides are known in the art for use in the manufacture of integrated circuits including chips (e.g. chip back end of line), thin film packages and printed circuit boards. Polyimides are useful in forming dielectric interlayers, passivation layers, alpha particle barriers and stress buffers. Photosensitive polyimides are particularly useful as an interlayer dielectric material to insulate the conductor wiring interconnecting the chips on a multichip module. This is known as thin-film wiring. A multichip module is an intermediate level of packaging between the chips and the circuit board. Multichip modules are generally known in the art. Multichip modules are made up of multiple layers of power, signal and ground planes which deliver power to the chips and distribute the input/output signals between chips on the module or to/from the circuit board. The use of photosensitive polyimide provides a simplified method for the fabrication of the patterned polyimide required for these thin film wiring schemes.

Photosensitive polyimides useful as a dielectric layer for conductor wiring in a multichip module are known in the art. "Polyimide Coatings" by Craig, Electronic Materials Handbook, Vol. 1, discloses negative tone photosensitive polyamic acid esters where the ester moiety is covalently bound to the polymer backbone and contains unsaturated linkages in the form of acrylates or methacrylates. Upon exposure to light, these groups, in conjunction with a suitable photopackage (photoinitiator and sensitizer), crosslink via a free radical mechanism resulting in differential solubility between the exposed and unexposed regions. Subsequent development with a suitable solvent system followed by a high temperature cure results in a negative tone imaged polyimide dielectric layer. However, during the high temperature cure, the components of the photopackage in the exposed area are volatilized resulting in excessive shrinkage of the polyimide. The shrinkage of the polyimide results in degradation of the quality of the image. In particular, the shrinkage causes tapering of the walls of image features (e.g. increase in wall angle determined by linewidth difference between the width a the bottom of the trench feature and the width at the top of the trench feature which normally expands outwardly to form a generally V-shaped trench.) Degradation of image quality can result in cross talk between circuit lines. There is still a need in the art for a suitable process for forming negative tone images of polyimide on a substrate with improved wall angles.

It is therefore an object of the present invention to provide an improved process for forming negative tone images of polyimide on a substrate.

Other objects and advantages will become apparent from the following disclosure.

SUMMARY OF THE INVENTION

The present invention relates to an improved process for generating a negative tone image of polyimide on a substrate comprising the steps of:

(a) coating the substrate with a film comprising polyamic ester and a photoinitiator:

(b) imagewise exposing the film to radiation to imagewise insolubilize said polyamic ester;

(c) developing the image;

(d) contacting said film with a base; and (e) heating said film to imidize said insolubilized polyamic ester.

Preferably, the ester substituent of the polyamic ester has a crosslinkable functionality which crosslinks when the film is imagewise exposed to radiation to imagewise insolubilize the film. Other methods of insolubilizing the film upon exposure to radiation may be used in the process of the present invention and the use of such methods in the process of the present invention is contemplated as equivalent to the process claimed herein. Preferably, the base is an amine or a quaternary ammonium salt and most preferably an amine. The base catalyzes the imidization of polyamic ester. In a preferred embodiment of the present invention, the polyamic ester is contacted with an aliphatic amine. The present invention also relates to integrated circuits such as an integrated circuit packaging structure comprising an imaged polyimide made by the process of the present invention.

A more thorough disclosure of the present invention is presented in the detail description which follows.

DETAILED DESCRIPTION OF THE INVENTION

The present invention relates to an improved process for forming negative tone images of polyimide on a substrate.

Suitable polyamic ester for use in the process of the present invention have the following general repeat unit:

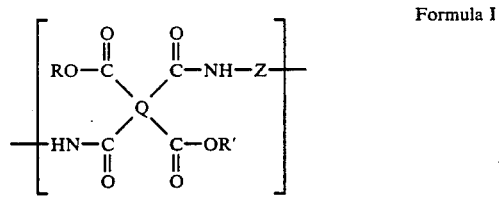

Formula I where R and R' are each independently selected from alkyl or aryl and at least one of which has a crosslinkable functionality which crosslinks when contacted with an activated photoinitiator to insolubilize the polyamic ester. Suitable crosslinkable functionalities include alkenyl, and alkynyl. Suitable R and R' crosslinkable substituents include ethylmethacrylate, propylmethacrylate, ethylacrylate, propargyl and N-methylacrylamide. Suitable R and R' noncrosslinkable substituents include lower alkyl such as methyl or ethyl. Other suitable R and R' substituents will be known to those skilled in the art.

A suitable Z is selected from, alkyl or aryl and optionally substituted with suitable substituents which do not interfere with the imidization nor the final properties of the polyimide. Preferably Z comprises a monocyclic or polycyclic divalent aromatic radical in which the aromatic rings may be aromatic heterocyclic, or directly attached rings, e.g., biphenylene and naphthalene. Suitable Z is selected from the class

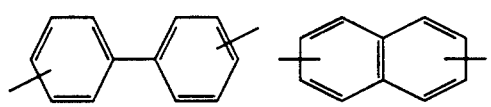

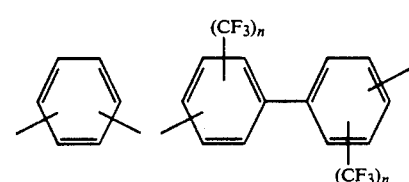

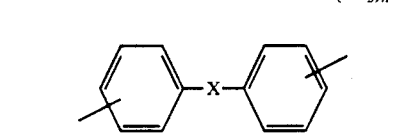

wherein X is selected from the group consisting of an alkylene chain having 1-3 carbon or halocarbon atoms, carbonyl —O—, —S—, —SO$_2$— and —N— alkyl. The aromatic radical can optionally be substituted by a variety of substituents such as alkyl, haloalkyl (trifluoromethyl) halo or the like Suitable Z include:

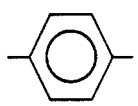

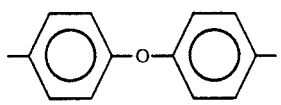

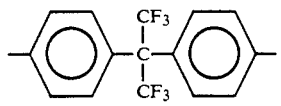

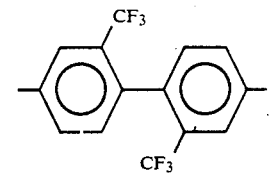

Suitable Q groups generally comprise tetravalent organic radical selected from cycloalkyl, aromatic and aromatic heterocyclic, wherein the aromatic generally has at least 6 carbon atoms characterized by benzenoid unsaturation and the four valencies are fixed by pairs on separate adjacent carbon atoms. When the aromatic radical comprises several rings connected together, the linking elements are for example a single bond or one of the following atoms or groups:

$$-O-;\ -S-;\ -SO-;\ -SO_2-;\ -CO-;$$
$$-CHOH-;\ -CH_2-;\ -CF_2-;\ -C(CH_3)_2-;$$
$$-C(CF_3)_2-;\ -COO-;\ -CONH-;$$
$$-CO-O-(CH_2)_x-O-CO-;\ -Si(CH_3)_2-;$$
$$-O-Si(CH_3)_2-O-.$$

Suitable Q groups include the following:

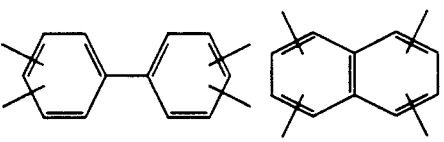

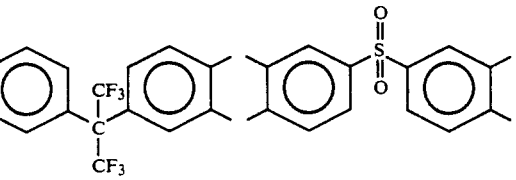

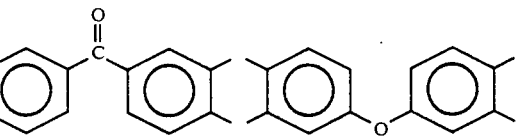

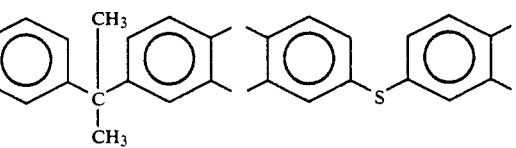

Other suitable Q groups will be known to those skilled in the art. Q may also be substituted with a variety of substituents known to those skilled in the art which do not interfere with the imidization nor the final properties of the polyimide.

The nature of Q and Z may impact the absorption of the radiation by the film and also the properties of the polyimide film. Generally, it is desired that the ester transmit light in the 250-500 nm range and form a polyimide with a rigid backbone to resist swelling and cracking during development. Suitable Q and Z" groups to obtain such properties are disclosed above and those skilled in the art will know other suitable Q and Z" groups to obtain these properties. Suitable polyamic alkyl esters will have a molecular weight of about 5000 to about 100,000, preferably about 10,000 to about 50,000. The polyamic alkyl esters will generally comprise about 70 weight % to about 99 weight % of the film.

Polyamic alkyl esters used in the present invention are readily prepared by art known techniques such as those disclosed in Volksen et al. "Polyamic Alkyl Esters: Versatile Polyimide precursors for Improved Dielectric Coatings" 41st Electronic Components and Technology Conference Proceedings p. 572 (May 1991) the disclosure of which is incorporated herein by references. Polyamic esters with suitable monoethylenically or monoacetylenically unsaturated groups can be prepared by reaction of typically about 2 moles of a substituted monoethylenically or monoacetylenically unsaturated compound containing an alcohol functionality with the dianhydride forming a half ester/acid monomer, followed by conversion to the diacyl chloride or imidazolide, followed by polymerization with a diamine. Examples of alcohols are hydroxyethylmethacrylate, hydroxypropylmethacrylate, hydroxyethylacrylate, and N-(hydroxymethyl) acrylamide, and propargyl alcohol. Copolymers can be formed by using mixtures of dianhydrides and/or diamines. Examples of polyimides made by the process of the present invention include poly(p-phenylene biphenyltetracarboximide), poly [bis (trifluoromethyl biphenylene) pyromellitimide], poly [bis trifluoromethyl biphenylene) biphenyltetracarboximide], poly [oxydiphenylene biphenyl tetracarboximide), poly (p-phenylene oxydiphthalimide) and poly (hexafluoroisopropylidene diphenylene biphenyltetracarboximide) and copolymers thereof.

The photoinitiator component of the film of the present invention forms an activated initiator upon exposure to radiation. The activated initiator causes crosslinking of the polyamic ester in the exposed regions of the film. Suitable photoinitiators include bis(dialkylamino) benzophenones, e.g., Michler's ketone and 4,4'-bis(diethylamino)benzophenone; other ketones, e.g. 2,5-bis(4-'diethylaminobenzal) cyclohexanone, 2,6-bis(4'-dimethylaminobenzal-4-methalcyclohexanone, 2,6-bis(4'-diethylaminobenzal)-4-methylcyclohexanone, 4,4'bis(dimethylamino) chalcone, 4,4'-bis(diethylamino) chalcone, p-dimethylaminocinnamylideneindanone, p-dimethylaminobenzylideneindanone, 2-(p-dimethylaminophenylvinylene) benzothiazole, 2-(p-dimethylaminophenylvinylene) isonaphthothiazole, 1,3-bis(4'-dimethylaminobenzal)acetone, 1,3-bis-carbonylbis(7-diethylaminocoumarin); ethanolamine derivatives and mercapto-containing aromatic heterocyclic compounds.

Te initiator is usually present in the film in amounts of about 1% to about 5%. The preferred initiators are:

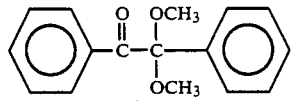

Irgacure 651

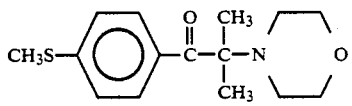

Irgacure 907 and

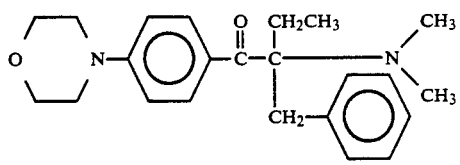

Ciba Geigy CG 25-369

Bases suitable for catalyzing the imidization of the polyamic ester in the process of the present invention include amines and quaternary ammonium salts. Suitable quaternary ammonium salts are those which thermally decompose to volatile by products such as lower alkyl salts (methyl, ethyl) with anions such as hydroxy, cyano, fluoro or acetate. Suitable amines are preferably aliphatic preferably secondary or teritary and preferably (i) straight chain or cyclic alkyl amines (ii) diamines or (iii) multifunctional amines. Preferably, the amine will be relatively non-volatile such as cyclohexylamine. Preferred amines are hydroxyalkylamines such as dimethylethanolamine or methyldiethanolamine or alkoxyamines such as amino bis(ethoxy)ethylamine. Other suitable amines will be known by those skilled in the art.

Aromatic and sterically hindered amines may not sufficiently catalyze the imidization reaction to enable the reaction to proceed at a satisfactory rate at a low temperature.

The film of the present invention may also include a photosensitizer. Photosensitizer enables the absorption of radiation of a different, generally longer wavelength than is being absorbed by the photoinitiator in the film. The absorbed energy is then transferred to the photoinitiator. Suitable photosensitizers for use in the present invention include thioxanthone, ketocoumarin, fluorenone, anthraquinone, naphthiazoline, biacetyl and benzil and derivatives thereof.

Optionally, the film may also comprise reactive diluent to obtain higher crosslink density. Suitable reactive diluents include polyethylenically unsaturated compounds that are capable of reacting upon exposure to radiation such as ultraviolet light, and usually those that contain terminal ethylenic groups. Such compounds include unsaturated esters of polyols and especially esters of the methylene carboxylic acid such as ethylene diacrylate; diethylene glycol diacrylate; glycerol diacrylate; and the like.

The process of the present invention for generating a negative tone image of polyimide involves five steps. The first step involves coating the substrate with a film comprising a suitable polyamic ester and a photoinitiator both dissolved in a suitable organic solvent Suitable substrates are comprised of silicon, ceramics, polymer or the like. Suitable organic solvents for the composition include N-methylpyrrolidione ("NMP") gamma butyrolactone diglyme dimethylacetamide and mixtures of NMP and xylene. Other suitable organic solvents will be known to those skilled in the art. The solute will generally comprise about 5 to 50 weight % of the solution. The mixture of polyamic ester and photoinitiator is generally coated onto a substrate as a thin film. The film can be coated on the substrate using art known techniques such as spin or spray coating, or doctor blading. In the second step of the process, the film is imagewise exposed to radiation suitably at a wavelength of about 250–500 nm. Suitable radiation sources include mercury, mercury/xenon, xenon lamps x-ray and e-beam. The radiation is absorbed by the photoinitiator to produce an activated initiator. The activated initiator causes crosslinking of the polyamic ester in the exposed region of the film.

The third step of the process of the present invention involves development of the image with a suitable solvent. Suitable solvents include polar solvents preferably aprotic polar solvents such as dimethyl formamide, N-methylpyrrolidinone or mixtures thereof. The solvent can be admixed with polymer nonsolvents such as glyme or diglyme to limit solvent absorption by the imaged polyamic ester film. The solvent dissolves the nonimaged polyamic acid ester.

The fourth step of the process of the present invention involves contacting the developed imaged film with a base preferably an amine. The amine causes partial imidization of the polyamic ester e.g. 20–90%) at room temperature and also catalyzes the subsequent thermal imidization enabling complete imidization of the ester at a lower temperature. Also the amine facilitates removal of remaining photoinitiator component and alcohols generated from the imidization from the film to minimize shrinkage during subsequent thermal imidization. Suitably the imaged polyamic ester film is dipped into liquid neat amine or a solution of the base. In an alternative embodiment, the amine can be sprayed or puddled onto the film. In a solution of the base, the base concentration may suitably vary from 1% to 15%. Suitable solvents for the base include glymes ketones, (e.g. cyclohexanone, acetone, MEK), PM acetate, or aromatic hydrocarbons such as xylene or chloroform. Optionally, the film may be heated to a low temperature of about 75° C. to 150° C. to facilitate the partial imidization prior to heating the film to higher temperatures to completely imidize the film.

The last step of the process of the present invention involves heating the film to complete the imidization of the imaged polyamic ester. The amine catalyzes the thermal imidization to enable complete imidization at lower temperature generally about 300 to about 350° C. The process of the present invention is especially useful for forming imaged polyimide films on thermally sensitive substrates. The amine treatment results in less shrinkage at the top of the trench upon thermal imidization. Further, the amine treatment facilitate more uniform shrinkage between dense and isolated features to result in narrower and more uniform linewidths between isolated and dense features which results in improved electrical performance.

The present invention also relates to integrated circuits such as integrated circuit packaging structures (multichip modules), circuit chips, circuit boards comprising a negative tone imaged polyimide made by the process of the present invention.

The integrated circuit of the present invention comprises a circuit formed in an imaged polyimide film on a substrate by the steps of
  (a) coating the substrate with a film comprising polyamic ester and a photoinitiator, the ester substituent of the polyamic ester having a crosslinkable functionality;
  (b) imagewise exposing the film to radiation to crosslink said polyamic ester;
  (c) developing the image;
  (d) contacting the film with an base;
  (e) heating said film to imidize said polyamic ester; and
  (f) forming the circuit in the developed film on the substrate by art known techniques.

After the substrate has been exposed, circuit patterns can be formed in the exposed areas by coating the substrate with a conductive material such as conductive metals by art known techniques such as evaporation, sputtering, electrolytic deposition chemical vapor deposition or laser induced deposition. The surface of the film can be milled to remove any excess conductive material. Dielectric materials may also be deposited by similar means during the process of making circuits. Inorganic ions such as boron, phosphorous or arsenic can be implanted in the substrate in the process for making p or n doped circuit transistors. Other means for forming circuits are well known to those skilled in the art.

A preferred embodiment of the present invention relates to an integrated circuit packaging structure for providing signal and power current to a plurality of integrated circuit chips comprising: (i) a substrate having electrical connecting means for connection to a circuit board, (ii) a plurality of alternating electrically insulating and conducting layers positioned on the substrate wherein at least one of the conducting layers comprises a negative tone imaged polyimide film made by the process of the present invention and (iii) a plurality of vias for electrically interconnecting electrical connecting means, conducting layers and integrated circuit chips.

The integrated circuit packaging structure is an intermediate level of packaging between the integrated circuit chip and the circuit board. The integrated circuit chips are mounted on the integrated circuit packaging structure which is in turn mounted on the circuit board.

The substrate of the packaging structure is generally an inert substrate such as glass, silicon or ceramic. The substrate can optionally have integrated circuits disposed therein. The substrate is provided with electrical connecting means such as input/output pins (I/O pins) for electrically connecting the packaging structure to the circuit board. A plurality of electrically insulating and electrically conducting layers (layers having conductive circuits disposed in an insulating material) are alternately stacked up on the substrate. The layers are generally formed on the substrate in a layer by layer process wherein each layer is formed in a separate process step. At least one of the conducting layers, comprises an integrated circuit formed in a negative tone imaged polyimide film formed by the process of the present invention.

The packaging structure also comprises receiving means for receiving the integrated circuit chips. Suitable receiving means include pinboards for receipt of chip I/O pins or metal pads for solder connection to the chip. Generally, the packaging structure also comprises a plurality of electrical vias generally vertically aligned to electrically interconnect the I/O pins, the conductive layers and integrated circuit chips disposed in the receiving means. The function, structure and method of manufacture of the integrated circuit packaging structure are well known to those skilled in the art as disclosed in U.S. Pat. Nos. 4,489,364; 4,508,981; 4,628,411 and 4,811,082, the disclosures of which are incorporated herein by reference.

The following examples are detailed descriptions of methods of preparation of the imaged polyimides of the present invention. The detailed preparations fall within the scope of, and serve to exemplify, the more generally described methods of preparation set forth above. The examples are presented for illustrative purposes only, and are not intended as a restriction on the scope of the invention.

Example 1

A polyamic acid ester was formed by reacting a mixture of p-phenylenediamine and 2,2-bis(4-aminophenyl)-hexafluoropropane with biphenyl-3,3',4,4'-tetracarboxylic acid, diethylmethacrylate, dichloride in NMP. The resulting polyamic acid ester can be isolated by precipitation in water and drying. The polyamic acid ester is mixed with about 3% by weight of Ciba-Geigy CG 25-369 initiator and 3% by weight of propoxythioxanthone sensitizer, and about 5% by weight of 2-ethyl-2-(hydroxymethyl)1,3-propane diol triacrylate diluent and then diluted with NMP to prepare about 35% by weight solution of total solids in solvent. The ester was spin coated onto a silicon wafer and imaged with a projection scanner (Canon MPA 1500) and developed NMP(10)/diglyme(90) to form imaged 12 micron lines. The wafer was then split in half by scribing.

One of the wafer segments was puddle treated with diethylamine for 15 min., spun to remove excess and baked at 85° C. for 15 min. Then both wafers were baked at 400° C. for 1 hr. The results were as follows:

|  | Amine Treated | Untreated |
|---|---|---|
|  | Pre Cured Top Dimension *(um) | |
| isolated trench | 19.8 | 19.8 |
| dense trench | 13.4 | 13.4 |
|  | Post Cured Top Dimension *(um) | |
| isolated trench | 27.2 | 30.8 |
| dense trench | 20.6 | 23.1 |
| iso/dense delta | 8.7 | 11.8 |

*bottom dimension for all samples 12 um
*dense trench generally 45 um spacing

Example II

The polyamic acid ester of Example 1 on glass ceramic substrate was process in accordance with Example 1 with exposure of 600 mJ using a projection scanner and a methyldiethanol amine treatment with postbake of 140° C. for 10 minutes. The results were as follows:

|  | Amine Treated | Untreated |
|---|---|---|
|  | Pre Cured Top Dimension *(um) | |
| isolated trench | 15.0 | 15.1 |
| dense trench | 14.3 | 14.2 |
|  | Post Cured Top Dimension *(um) | |
| isolated trench | 32.6 | 35.5 |
| dense trench | 23.9 | 23.7 |
| iso/dense delta | 8.7 | 11.8 |

*bottom dimension 12 um.

Example III

Following the procedure of Example II except the polyamic ester was exposed to 750 mJ/cm$^2$ (G-line 436 nm), the following results were obtained.

|  | Amine Treated | Untreated |
|---|---|---|
|  | Pre Cured Top Dimension *(um) | |
| isolated trench | 19.2 | 19.4 |
| dense trench | 17.9 | 17.9 |
|  | Post Cured Top Dimension *(um) | |
| isolated trench | 37.2 | 45.1 |
| dense trench | 28.2 | 27.2 |
| iso/dense delta | 9.0 | 17.9 |

*bottom dimension 12 um.

Although this invention has been described with respect to specific embodiments, the details thereof are not to be construed as limitations for it will be apparent that

Example IV

Following the procedure of Example II with a postbake of 80° C. for 30 min. The following results were obtained.

|  | Amine Treated | Untreated |
|---|---|---|
|  | Pre Cured Top Dimension *(um) | |
| isolated trench | 26.0 | 17.6 |
| dense trench | 20.0 | 15.9 |
|  | Post Cured Top Dimension *(um) | |
| isolated trench | 29.9 | 33.8 |
| dense trench | 25.0 | 23.7 |
| iso/dense delta | 4.9 | 10.1 |

*bottom dimension for all samples 12 um
*dense trench generally 45 um spacing

Various embodiments, changes and modifications may be resorted to without departing from the spirit and scope thereof, and it is understood that such equivalent embodiments are intended to be included within the scope of this invention.

We claim:

1. A process for generating a negative tone image of polyimide on a substrate comprising the steps of:
    (a) coating the substrate with a film comprising polyamic ester and a photoinitiator, the ester substituent of said polyamic ester having a crosslinkable functionality;
    (b) imagewise exposing the film to radiation to crosslink said polyamic ester;
    (c) developing the image;
    (d) contacting said film with a base selected from amine or quaternary ammonium salt;
    (e) heating said film to imidize said polyamic ester 2. The process of claim 1 wherein said base is an amine.

3. The process of claim 2 wherein said amine is a hydroxyalkylamine.

4. The process of claim 1 wherein said polyimide is selected from poly(p-phenylene biphenyltetracarboximide), poly(p-oxydiphenylene pyromellitimide), poly [bis(trifluoromethyl) biphenylene) pyromellitimide], poly [bis(trifluoromethyl biphenylene) biphenyltetracarboximide], poly(oxydiphenylene biphenyl tetracarboximide), poly (p-phenylene oxydiphthalimide) and poly (hexafluoroisopropylidene diphenylene biphenyltetracarboximide) and copolymers thereof.

* * * * *